(12) United States Patent
Namerikawa et al.

(10) Patent No.: US 7,564,173 B2
(45) Date of Patent: Jul. 21, 2009

(54) PIEZOELECTRIC ACTUATOR DEVICE FOR ULTRASONIC MOTOR

(75) Inventors: Masahiko Namerikawa, Seto (JP); Masayuki Uetani, Kasugai (JP); Hideki Shimizu, Ohbu (JP); Tomohiro Yamada, Komaki (JP); Nobuo Takahashi, Kasugai (JP)

(73) Assignee: NGK Insulators, Ltd., Nagoya-shi (JP)

( * ) Notice: Subject to any disclaimer, the term of this patent is extended or adjusted under 35 U.S.C. 154(b) by 140 days.

(21) Appl. No.: 11/842,233

(22) Filed: Aug. 21, 2007

(65) Prior Publication Data

US 2008/0048526 A1 Feb. 28, 2008

Related U.S. Application Data

(60) Provisional application No. 60/839,475, filed on Aug. 23, 2006, provisional application No. 60/864,434, filed on Nov. 6, 2006, provisional application No. 60/867,418, filed on Nov. 28, 2006.

(51) Int. Cl.
*H01L 41/083* (2006.01)
(52) U.S. Cl. ...................... 310/328; 310/366
(58) Field of Classification Search ............. 310/328, 310/333, 366
See application file for complete search history.

(56) References Cited

U.S. PATENT DOCUMENTS

| | | | | |
|---|---|---|---|---|
| 4,780,639 A * | 10/1988 | Shirasu | ............ | 310/328 |
| 5,128,544 A * | 7/1992 | Iwatsuki | ............ | 250/306 |
| 5,345,137 A * | 9/1994 | Funakubo et al. | ...... | 310/323.16 |
| 5,453,653 A | 9/1995 | Zumeris | | |
| 5,616,980 A | 4/1997 | Zumeris | | |
| 5,900,790 A * | 5/1999 | Unami et al. | ............ | 333/187 |
| 6,191,522 B1 * | 2/2001 | Reuter | ............ | 310/328 |

FOREIGN PATENT DOCUMENTS

| | | | |
|---|---|---|---|
| JP | 07-337044 A1 | | 12/1995 |
| JP | 08-228030 A1 | | 9/1996 |
| JP | 08-237971 A1 | | 9/1996 |
| JP | 10-044439 | * | 2/1998 |
| JP | 2001-503920 T | | 3/2001 |

OTHER PUBLICATIONS

B. Koc, et al., "*Piezoelectric Ultrasonic Motors for Lens Positioning of Cellular Phone Camera Modules*," Proceedings for Actuator 2006 A1.1.

* cited by examiner

*Primary Examiner*—Thomas M Dougherty
(74) *Attorney, Agent, or Firm*—Burr & Brown (57) ABSTRACT

An ultrasonic motor piezoelectric actuator element uses a primary longitudinal mode and a secondary bending mode and includes a stacked piezoelectric element in which piezoelectric layers and electrode layers are stacked alternately in such a manner that the electrode layers divide the piezoelectric layers into two approximately equal portions. A piezoelectric inactive region is formed from the surface portion to the center portion in the thickness direction of the stacked piezoelectric element. The migration resistance of the piezoelectric actuator element is improved while suppressing a decrease in displacement so that a short circuit can be prevented and portions generating heat during alternating polarization can be dispersed, whereby reliability is increased. Moreover, the amount of electrode material used can be reduced, whereby cost can be reduced.

7 Claims, 7 Drawing Sheets

UPPER AND LOWER　　　CENTER OF ELEMENT
SURFACES OF ELEMENT

PIEZOELECTRIC ACTUATOR DEVICE FOR ULTRASONIC MOTOR

BACKGROUND OF THE INVENTION AND RELATED ART

The present invention relates to an ultrasonic motor piezoelectric actuator element.

An ultrasonic motor utilizing the resonant mode of an elastic body exhibits excellent controllability and has attracted attention particularly as a precise positioning actuator. A linear ultrasonic motor is generally required as an actuator for various stages. Therefore, various types of linear ultrasonic motors have been proposed and studied. In particular, various ultrasonic motors utilizing composite longitudinal (expansion and contraction) vibrations and bending vibrations of a rectangular plate have been studied (see, for example, Patent Document 1). Among them, for example, an ultrasonic motor having a principle disclosed in the Patent Document 1 has been put to practical use for various applications, wherein a rectangular piezoelectric element plate is polarized in its thickness direction, four divided electrodes are provided on the piezoelectric element plate, and a vibrator formed of the piezoelectric element is caused to produce longitudinal vibrations and bending vibrations by applying a driving signal to a pair of electrodes located on the diagonal line of the vibrator to drive a moving body in contact with the vibrator.

The Non-patent Document 1 discloses an ultrasonic motor element using a primary longitudinal mode and a secondary bending mode and has a description of a piezoelectric actuator element where rectangular piezoelectric layers and electrode layers are stacked alternately in such a manner that the electrode layers divide the piezoelectric layers into two approximately equal portions.

Figure 13A:
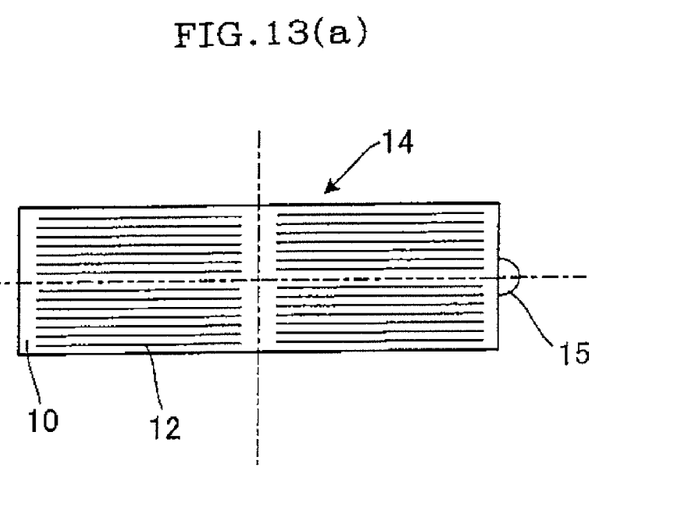
Figure 13B:
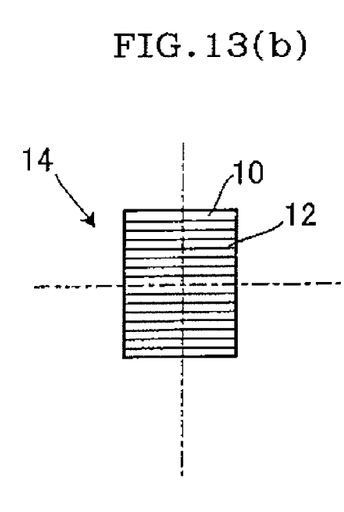

FIGS. 13(a) and 13(b) are schematic views showing this piezoelectric actuator element. The piezoelectric actuator element has a structure in which piezoelectric layers 10 and electrode layers 12 are stacked alternately. This piezoelectric actuator element operates similarly to the piezoelectric element having the structure disclosed in the Patent Document 1. Specifically, a vibrator formed of a piezoelectric element is caused to produce longitudinal vibrations and bending vibrations to drive a member in contact with the vibrator.

[Patent Document 1] Japanese Patent No. 2980541 Specification Non-patent Document 1 Proceedings for Actuator 2006 A1.1 (Piezoelectric Ultrasonic Motors for Lens Positioning of Cellular Phone Camera Modules).

However, the structure disclosed in the Patent Document 1 requires an extremely high voltage to drive the vibrator, whereby a large voltage booster circuit is necessary. This results in an increase in size and complexity of a driver circuit, thereby increasing the cost of the driver circuit. This makes it difficult to apply the structure disclosed in the Patent Document 1 to small-sized instruments (particularly instruments driven by a battery). If the thickness of the piezoelectric element (vibrator) is small, a sufficient output cannot be obtained. Moreover, the piezoelectric element may break due to low mechanical strength.

The ultrasonic motor element disclosed in the Non patent Document 1 contributes to reducing the size of the driver circuit as compared with the structure disclosed in the Patent Document 1. However, since degree of sintering of the center portion of the element is poor after sintering, migration tends to occur. Moreover, when the element is subjected to alternating polarization in order to achieve highly efficient polarization, the amount of heat generated in the element increases, and thereby cracks tend to occur in the center portion of the element.

In this ultrasonic motor element, since the electrodes are located at an identical position in the projection plane of the element (i.e. the electrodes are provided at an identical distance), the stacking pressure is applied to the piezoelectric regions to only a small extent near the edge of the electrode, whereby inferior stacking or delamination tends to occur.

SUMMARY OF THE INVENTION

An object of the present invention is to provide a piezoelectric actuator element which ensures that a stacked piezoelectric element exhibits improved migration resistance near the center in the thickness direction where migration tends to occur.

Another object of the present invention is to provide a piezoelectric actuator element which prevents local heat generation during an alternating polarization treatment and prevents cracks during polarization.

According to the present invention, there is provided an ultrasonic motor piezoelectric actuator element using a primary longitudinal mode and a secondary bending mode and comprising a stacked piezoelectric element in which piezoelectric layers and electrode layers are stacked alternately in such a manner that the electrode layers divide the piezoelectric layers into two approximately equal portions, wherein a piezoelectric inactive region is formed from a surface portion to a center portion in the thickness direction of the stacked piezoelectric element.

In an ultrasonic motor piezoelectric actuator element of the present invention, it is preferable that the piezoelectric inactive region have a thickness of 10% or more of the thickness of the piezoelectric actuator element in the stacking direction from the surface portion to the center portion. It is preferable that heat-generating portions which generate heat when subjecting the stacked piezoelectric element to a polarization treatment be dispersed.

In an ultrasonic motor piezoelectric actuator element of the present invention, it is preferable that the stacked piezoelectric element be formed so that the formation density of the electrode layers is smaller in the center portion in the thickness direction of the stacked piezoelectric element than in the surface portion of the stacked piezoelectric element and that the electrode-to-electrode distance is larger in the center portion in the thickness direction of the stacked piezoelectric element than in the surface portion of the stacked piezoelectric element.

In an ultrasonic motor piezoelectric actuator element of the present invention, it is preferable that the stacked piezoelectric element be formed so that the area of the electrode layer is smaller in the center portion in the thickness direction of the stacked piezoelectric element than in the surface portion of the stacked piezoelectric element and the that electrode layer is not formed in the center portion in the thickness direction of the stacked piezoelectric element.

BRIEF DESCRIPTION OF THE DRAWINGS

FIGS. 1(a) and 1(b) show one embodiment of an ultrasonic motor piezoelectric actuator element of the present invention. FIG. 1(a) is a front view, and FIG. 1(b) is a side view.

FIGS. 2(a) and 2(b) show another embodiment of an ultrasonic motor piezoelectric actuator element of the present invention, FIG. 2(a) is a front view, and FIG. 2(b) is a side view.

FIGS. 4(a) and 4(b) show another embodiment of an ultrasonic motor piezoelectric actuator element of the present invention. FIG. 4(a) is a front view, and FIG. 4(b) is a side view.

FIGS. 5(a) and 5(b) show another embodiment of an ultrasonic motor piezoelectric actuator element of the present invention. FIG. 5(a) is a front view, and FIG. 5(b) is a side view.

FIGS. 6(a) and 6(b) show another embodiment of an ultrasonic motor piezoelectric actuator element of the present invention. FIG. 6(a) is a front view, and FIG. 6(b) is a side view.

FIGS. 7(a) and 7(b) show another embodiment of an ultrasonic motor piezoelectric actuator element of the present invention. FIG. 7(a) is a front view, and FIG. 7(b) is a side view.

FIGS. 8(a) and 8(b) show another embodiment of an ultrasonic motor piezoelectric actuator element of the present invention, FIG. 8(a) is a front view, and FIG. 8(b) is a side view.

FIGS. 9(a) and 9(b) show another embodiment of an ultrasonic motor piezoelectric actuator element of the present invention. FIG. 9(a) is a front view, and FIG. 9(b) is a side view.

FIGS. 10(a) and 10(b) show another embodiment of an ultrasonic motor piezoelectric actuator element of the present invention. FIG. 10(a) is a front view, and FIG. 10(b) is a side view.

FIGS. 11(a) and 11(b) show another embodiment of an ultrasonic motor piezoelectric actuator element of the present invention. FIG. 11(a) is a front view, and FIG. 11(b) is a side view.

FIGS. 12(a) and 12(b) show another embodiment of an ultrasonic motor piezoelectric actuator element of the present invention. FIG. 12(a) is a front view, and FIG. 12(b) is a side view.

FIGS. 13(a) and 13(b) show an outline of the constitution of a conventional ultrasonic motor piezoelectric actuator element. FIG. 13(a) is a front view, and FIG. 13(b) is a side view.

DETAILED DESCRIPTION OF THE INVENTION

Embodiments of the present invention are described below in detail. Note that the present invention is not limited to the following embodiments. Various alterations, modifications, and improvements may be made within the range of not deviating from the scope of the present invention based on knowledge of a person skilled in the art.

A piezoelectric actuator element of the present invention basically includes a stacked piezoelectric element in which piezoelectric layers and electrode layers are stacked alternately in such a manner that the electric layers divide the piezoelectric layers into two approximately equal portions. The stacked piezoelectric element undergoes bending displacement such as in a primary longitudinal mode and a secondary bending mode by applying a voltage to the stacked piezoelectric element. The basic structure of the stacked piezoelectric element, the primary longitudinal mode, and the secondary bending mode are described in the Non-patent Document 1. The description of this document is incorporated herein by reference.

The piezoelectric actuator element of the present invention is characterized in that a piezoelectric inactive region is formed in an inner layer of the stacked piezoelectric element. The piezoelectric inactive region is formed near the center of the stacked piezoelectric element in the thickness direction so that the thickness of the piezoelectric inactive region is preferably 10% or more, more preferably 10% to 50%, and particularly preferably 10% to 40% of the thickness of the stacked piezoelectric element in the stacking direction. If the thickness of the piezoelectric inactive region is greater than 50% of the thickness of the stacked piezoelectric element in the stacking direction, the driving amplitude of the element significantly decreases with respect to an input signal when the element is driven. If the thickness of the piezoelectric inactive region is less than 10%, cracks tend to occur during polarization (refer to Examples 1 and 2 described later).

The migration resistance of the stacked piezoelectric element is improved by forming the piezoelectric inactive region in the inner layer of the stacked piezoelectric element, whereby a short circuit can be prevented.

The stacked piezoelectric element is subjected to a polarization treatment before use. It is preferable that heat-generating portions which generate heat during the polarization treatment be dispersed in the element since cracking can be prevented during the polarization treatment.

As a specific means for dispersing the heat-generating portions which generate heat, a method of forming a piezoelectric inactive region in an inner layer of the stacked piezoelectric element can be given. This piezoelectric inactive region is formed near the center of the stacked piezoelectric element in the thickness direction so that the thickness of the piezoelectric inactive region is preferably 10% or more, more preferably 10% to 50%, and particularly preferably 10% to 40% of the thickness of the stacked piezoelectric element in the stacking direction in the same manner as described above.

Figure 2A:
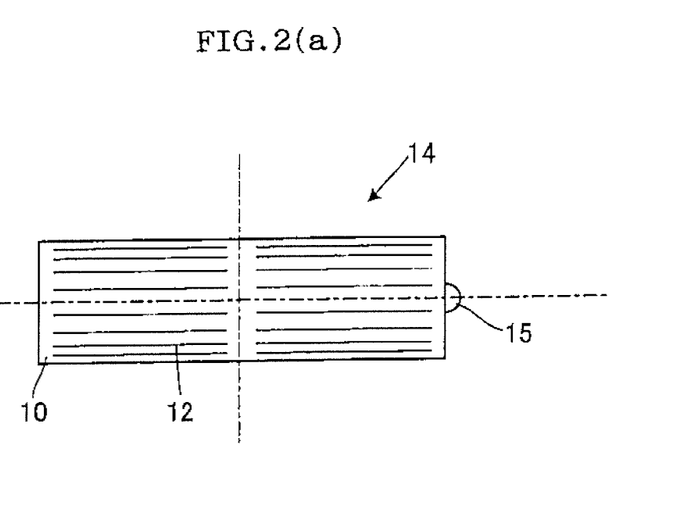
Figure 2B:
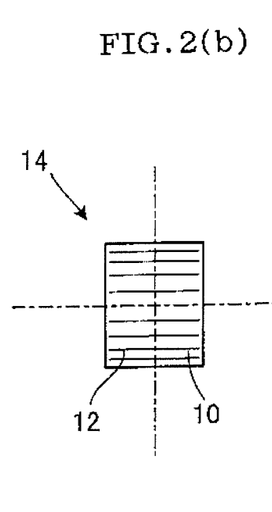

In the present invention, it is preferable that the stacked piezoelectric element be formed so that the formation density of the electrode layers is smaller in the center portion of the stacked piezoelectric element in the thickness direction than in the surface portion of the stacked piezoelectric element. In order to form stacked piezoelectric element so as to have a small formation density of the electric layers, for example, it is preferable that the stacked piezoelectric element be formed so that the electrode-to-electrode distance is larger in the center portion of the stacked piezoelectric element in the thickness direction than in the surface portion of the stacked piezoelectric element, as shown in FIGS. 2(a) and 2(b), or that the area of the electrode layers is smaller in the center portion of the stacked piezoelectric element in the thickness direction than in the surface portion of the stacked piezoelectric element, as shown in FIGS. 4(a) and 4(b) to FIGS. 10(a) and 10(b).

The migration resistance of the stacked piezoelectric element is improved while suppressing a decrease in displacement by forming the piezoelectric inactive region in the inner layer of the stacked piezoelectric element so that the formation density of the electrode layers is smaller in the center portion of the stacked piezoelectric element in the thickness direction than in the surface portion of the stacked piezoelectric element. This enables a short circuit to be prevented and the portions generating heat during alternating polarization to be dispersed, whereby reliability is increased. Moreover, the amount of electrode material used can be reduced, whereby the cost can be reduced.

The materials used for the piezoelectric actuator element of the present invention are described below.

A piezoelectric ceramic is suitably used for the piezoelectric layer. Note that an electrostrictive ceramic, a ferroelectric ceramic, or an antiferroelectric ceramic may also be used. Specific examples of the material for the piezoelectric layer include ceramics containing lead zirconate, lead titanate, lead magnesium niobate, lead nickel niobate, lead zinc niobate, lead manganese niobate, lead antimony stannate, lead manganese tungstate, lead cobalt niobate, barium titanate, sodium bismuth titanate, bismuth neodymium titanate, potassium sodium niobate, and strontium bismuth tantalate either individually or in combination of two or more.

It is preferable that the electrode layer be formed of a metal which is solid at room temperature and exhibits excellent conductivity. For example, a metal such as aluminum, titanium, chromium, iron, cobalt, nickel, copper, zinc, niobium, molybdenum, ruthenium, palladium, rhodium, silver, tin, tantalum, tungsten, iridium, platinum, gold, or lead, or an alloy of these metals is used. A cermet material may also be used in which the same material as the material for the piezoelectric layer is dispersed in such a metal or alloy.

Various embodiments of the piezoelectric actuator element according to the present invention are described with reference to the drawings.

Figure 1A:
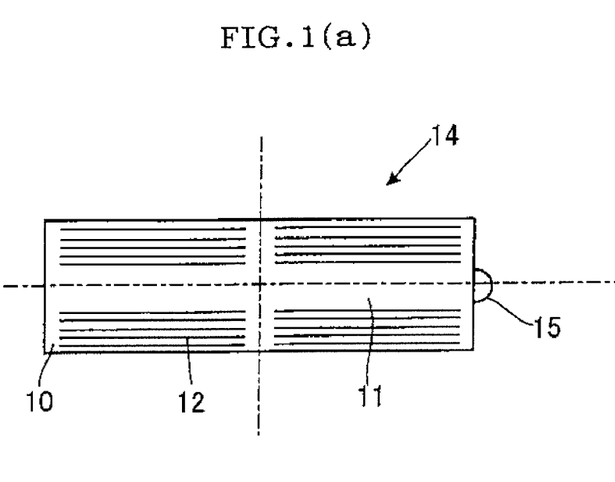
Figure 1B:
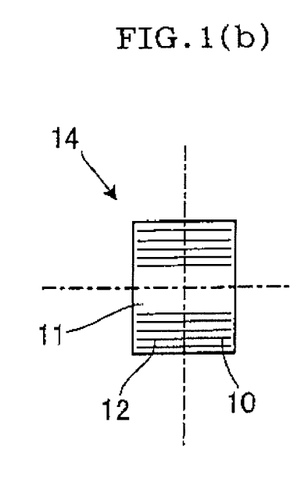

FIGS. 1(a) and 1(b) show one embodiment of an ultrasonic motor piezoelectric actuator element of the present invention. The ultrasonic motor piezoelectric actuator element includes a stacked piezoelectric element 14 in which piezoelectric layers 10 and electrode layers 12 are stacked alternately in such a manner that the electrode layers 12 divide the piezoelectric layers 10 into two approximately equal portions, and a piezoelectric inactive region (region in which the electrode layer is not formed) 11 is formed from the surface portion to the center portion in the thickness direction of the stacked piezoelectric element 14. A reference numeral 15 indicates a frictional member.

Figure 3:
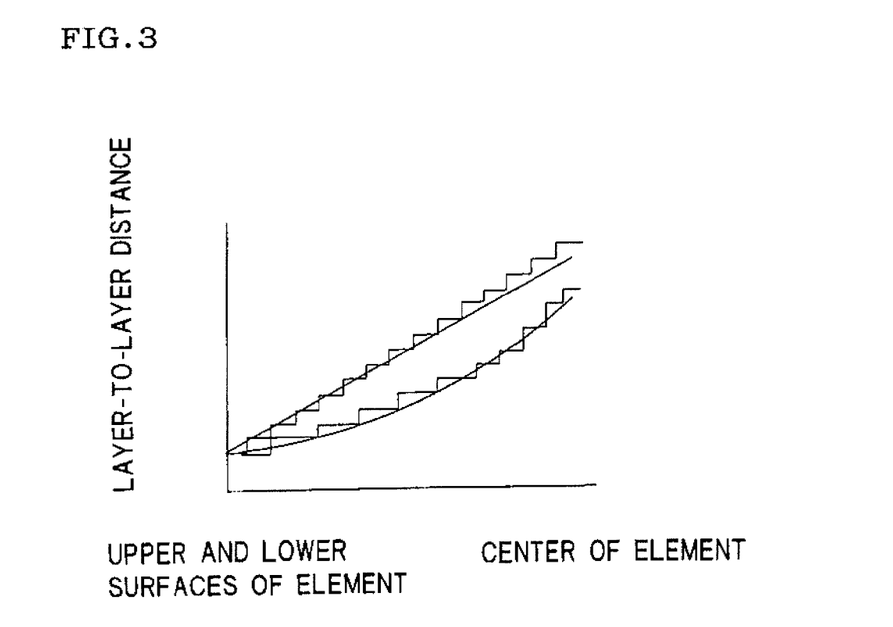
FIG. 3 is a graph showing a change in the electrode-to-electrode distance (distance between layers) from the upper and lower surfaces to the center portion of the element.
Figures 4A, 4B:
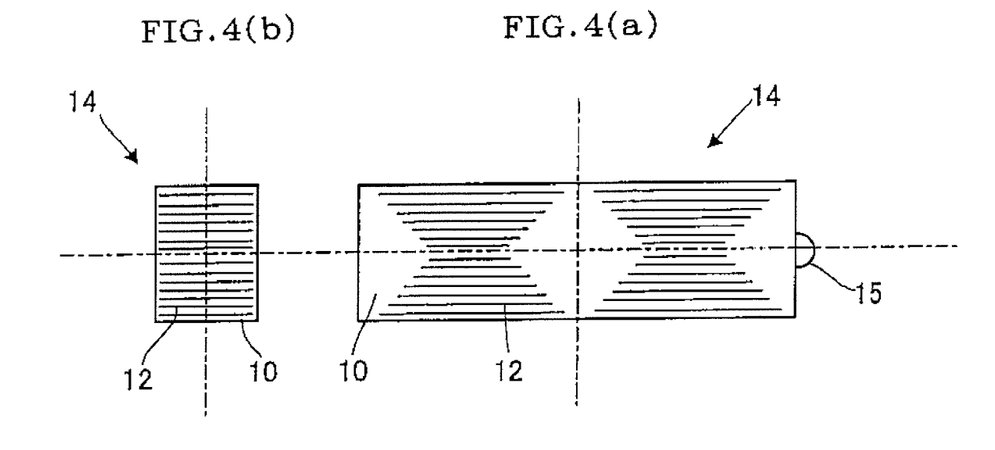
Figures 5A, 5B:
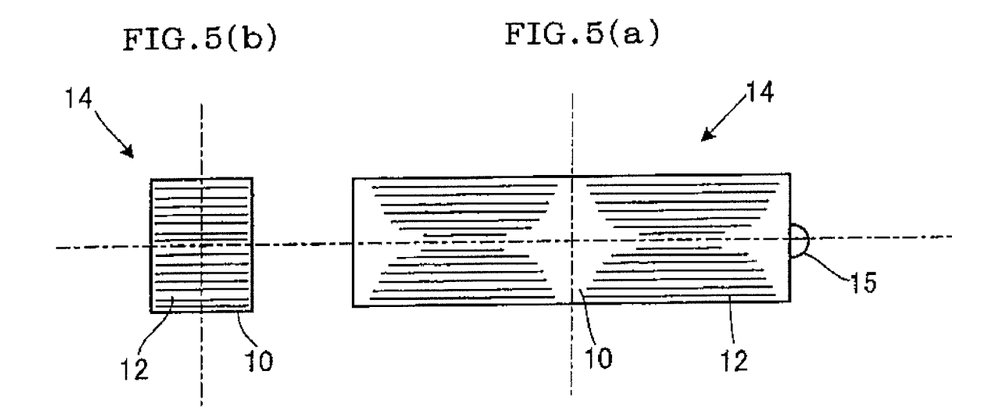

FIGS. 2(a) and 2(b) show another embodiment of a piezoelectric actuator element of the present invention. The ultrasonic motor piezoelectric actuator element includes a stacked piezoelectric element 14 in which piezoelectric layers 10 and electrode layers 12 are stacked alternately in such a manner that the electrode layers 12 divide the piezoelectric layers 10 into two approximately equal portions, and the stacked piezoelectric element 14 is formed so that the electrode-to-electrode distance is larger in the center portion in the thickness direction of the stacked piezoelectric element 14 than in the surface portion of the stacked piezoelectric element 14. That is, the electrode-to-electrode distance is the same as that of the conventional example shown in FIGS. 13(a) and 13(b) near the upper and lower surface portions in the thickness direction of the stacked piezoelectric element 14, and is larger in the center portion in the thickness direction of the stacked piezoelectric element 14. As shown in FIG. 3, the change in the electrode-to-electrode distance from the upper and lower surface portions to the center portion may be linear or exponential functional. It is preferable that the change in the electrode-to-electrode distance be exponential functional. The electrode-to-electrode distance (distance between the electrode layers) may change by two or more layers (stepwise).

Figures 6A, 6B:
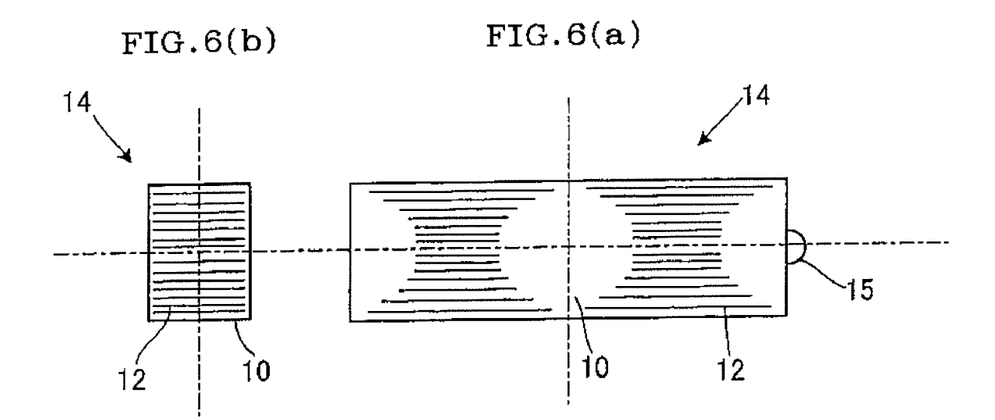
Figures 7A, 7B:
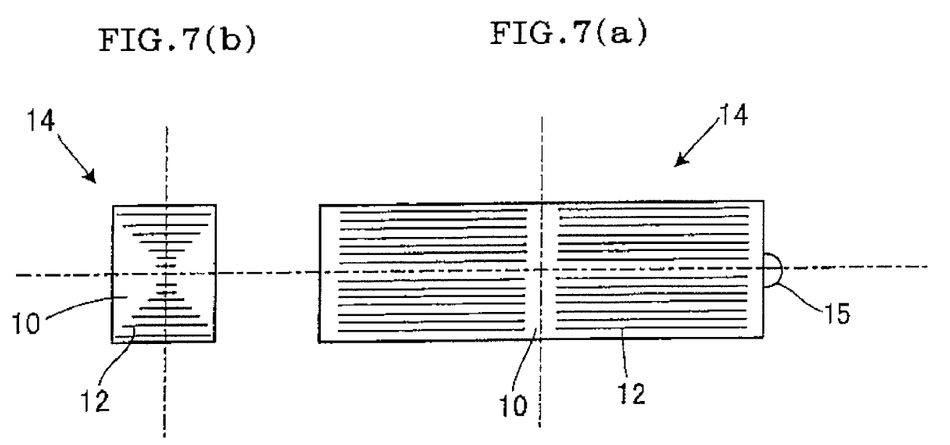
Figures 8A, 8B:
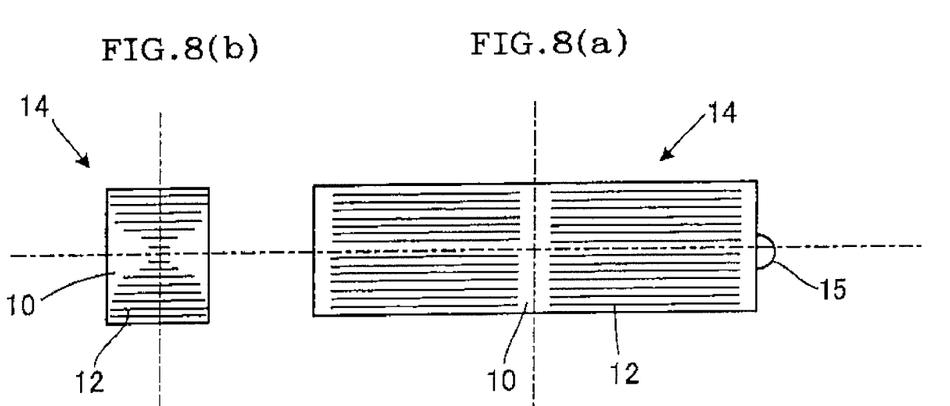

FIGS. 4(a) and 4(b) to FIGS. 6(a) and 6(b) respectively show other embodiments of a piezoelectric actuator element of the present invention. The stacked piezoelectric element 14 is formed so that the area of the electrode layers 12 is smaller in the center portion in the thickness direction of the stacked piezoelectric element 14 than in the surface portion of the stacked piezoelectric element 14. That is, the length of the electrode is the same as that of the conventional example shown in FIGS. 13(a) and 13(b) near the upper and lower surface portions in the thickness direction of the stacked piezoelectric element 14 and is smaller in the center portion in the thickness direction of the stacked piezoelectric element 14 (i.e., the electrodes are disposed around the B2 mode bending point). The change rate of the length of the electrode may be linear functional (see FIGS. 4(a) and 4(b)) or higher-order functional or exponential functional (see FIGS. 5(a) and 5(b) and FIGS. 6(a) and 6(b)). The embodiment shown in FIGS. 6(a) and 6(b) is preferred in which the change rate becomes smaller toward the center portion in the thickness direction and becomes larger toward the upper and lower surface portions. This suppresses generation of heat at the center portion of the stacked piezoelectric element 14 in which heat is dissipated to only a small extent.

According to the embodiments shown in FIGS. 4(a) and 4(b) to FIGS. 6(a) and 6(b), costs can be reduced (i.e., the amount of electrode material can be reduced) while suppressing a decrease in displacement. Since the portions generating heat during alternating polarization can be dispersed, and the edges of the electrodes do not overlap, the in-plane distribution of the stacking pressure becomes gentle to reduce inferior stacking, and the stress occurring at the edge during polarization is reduced.

Figures 9A, 9B:
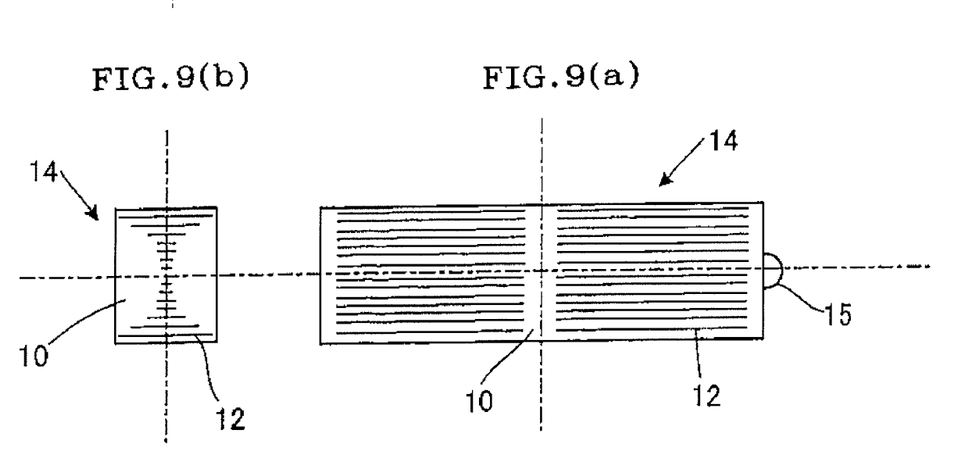

FIGS. 7(a) and 7(b) to FIGS. 9(a) and 9(b) respectively show other embodiments of a piezoelectric actuator element of the present invention. The stacked piezoelectric element 14 is formed so that the width of the electrode is the same as that of the conventional example shown in FIGS. 13(a) and 13(b) near the upper and lower surface portions in the thickness direction of the stacked piezoelectric element 14, and is smaller in the center portion in the thickness direction of the stacked piezoelectric element 14. The change rate of the width of the electrode may be linear functional (see FIGS. 7(a) and 7(b)) or higher-order functional or exponential functional (see FIGS. 8(a) and 8(b) and FIGS. 9(a) and 9(b)). The embodiment shown in FIGS. 9(a) and 9(b) is preferred in which the change rate becomes smaller toward the center portion in the thickness direction and becomes larger toward the upper and lower surface portions. This suppresses generation of heat at the center portion of the stacked piezoelectric element 14 in which heat is dissipated to only a small extent.

The embodiments shown in FIGS. 7(a) and 7(b) to FIGS. 9(a) and 9(b) have almost the same effects as the embodiments shown in FIGS. 4(a) and 4(b) to FIGS. 6(a) and 6(b).

Figures 10A, 10B:
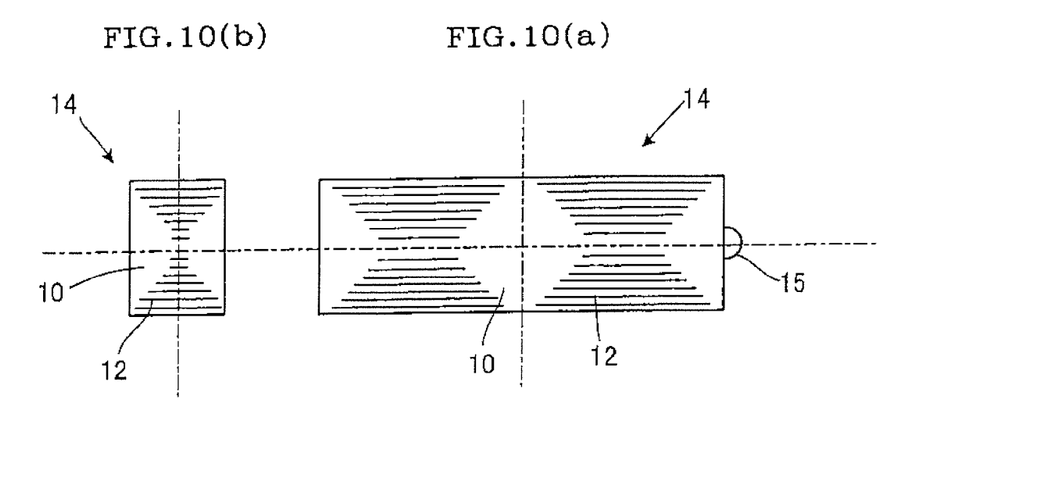

FIGS. 10(a) and 10(b) show another embodiment of the piezoelectric actuator element according to the present invention. The embodiment shown in FIGS. 10(a) and 10(b) is the combination of the embodiments shown in FIGS. 4(a) and 4(b) to FIGS. 6(a) and 6(b) and the embodiments shown in FIGS. 7(a) and 7(b) to FIGS. 9(a) and 9(b).

Figures 11A, 11B:
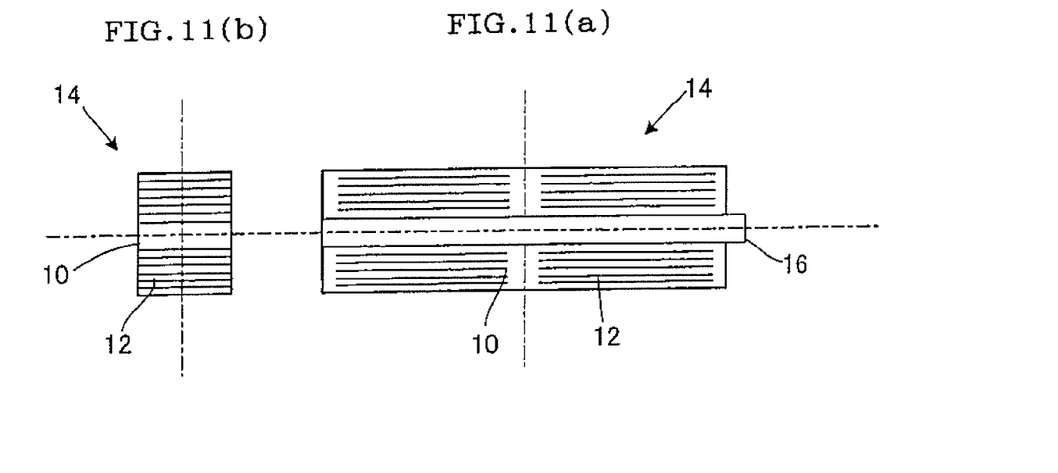

FIGS. 11(a) and 11(b) show another embodiment of a piezoelectric actuator element of the present invention, wherein the electrode layer is not formed in the center portion in the thickness direction of the stacked piezoelectric element 14 and a ceramic sheet member 16 having a strength higher than that of the material forming the piezoelectric layer 10 is integrally formed. In this embodiment, the high-strength ceramic sheet member 16 such as zirconia is integrally fired in the center portion in the thickness direction of the stacked piezoelectric element 14, and one end or both ends of the ceramic sheet member 16 protrude from the piezoelectric portion of the stacked piezoelectric element 14 to function as a frictional member.

This embodiment makes it unnecessary to additionally provide a frictional member differing from the embodiments shown in FIGS. 1(a) and 1(b) and the like to reduce costs, and also makes it unnecessary to provide an adhesive for bonding the frictional member to ensure excellent temperature characteristics.

Figures 12A, 12B:
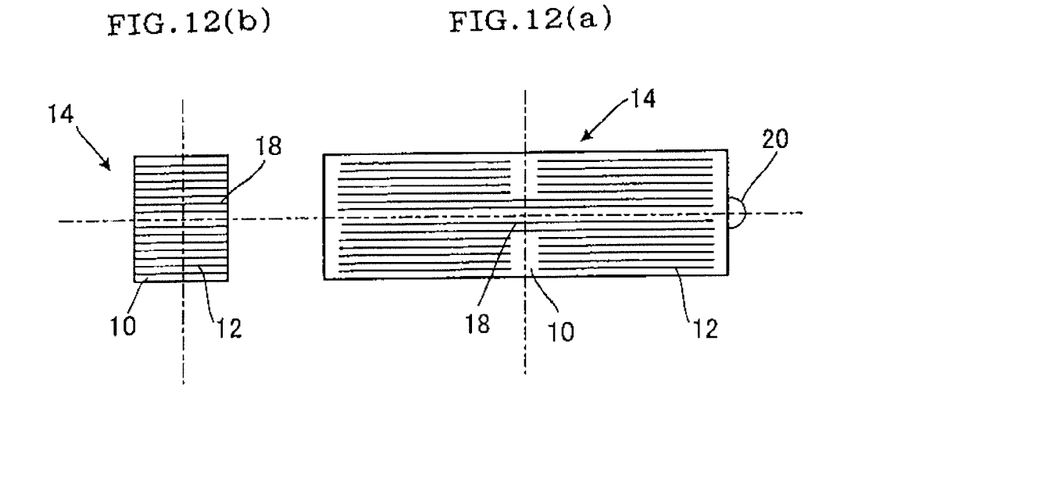

FIGS. 12(a) and 12(b) show yet another embodiment of a piezoelectric actuator element of the present invention, wherein an electrode layer 18 is formed over the entire length of the stacked piezoelectric element 14 in the center portion in the thickness direction of the stacked piezoelectric element 14. According to this embodiment, the balance between the displacement in the x direction and the displacement in the y direction of a frictional member 20 due to L1 and B2 vibra tions can be optimized by appropriately selecting the number of electrode layers 18 formed over the entire length of the stacked piezoelectric element 14, whereby driving efficiency can be increased.

center of the element was improved due to the pressure of the piezoelectric inactive layer so that the number of micropores serving as water adsorption sites decreased, whereby the migration resistance of the element was improved.

TABLE 1

| | Percentage of inactive layer | Number of samples subjected to endurance test | Number of samples in which short circuit occurred | | | | | | |
|---|---|---|---|---|---|---|---|---|---|
| | | | 50 hr | 100 hr | 150 hr | 200 hr | 400 hr | 800 hr | 1000 hr |
| Comparative Example 1 | 0% | 5 | 0/5 | 1/5 | 3/5 | 5/5 | — | — | — |
| Example 1 | 2% | 5 | 0/5 | 0/5 | 2/5 | 3/5 | 5/5 | — | — |
| Example 2 | 5% | 5 | 0/5 | 0/5 | 0/5 | 1/5 | 1/5 | 2/5 | 3/5 |
| Example 3 | 7% | 5 | 0/5 | 0/5 | 0/5 | 0/5 | 0/5 | 1/5 | 1/5 |
| Example 4 | 10% | 5 | 0/5 | 0/5 | 0/5 | 0/5 | 0/5 | 0/5 | 0/5 |
| Example 5 | 15% | 5 | 0/5 | 0/5 | 0/5 | 0/5 | 0/5 | 0/5 | 0/5 |
| Example 6 | 20% | 5 | 0/5 | 0/5 | 0/5 | 0/5 | 0/5 | 0/5 | 0/5 |
| Example 7 | 25% | 5 | 0/5 | 0/5 | 0/5 | 0/5 | 0/5 | 0/5 | 0/5 |
| Example 8 | 30% | 5 | 0/5 | 0/5 | 0/5 | 0/5 | 0/5 | 0/5 | 0/5 |
| Example 9 | 35% | 5 | 0/5 | 0/5 | 0/5 | 0/5 | 0/5 | 0/5 | 0/5 |
| Example 10 | 40% | 5 | 0/5 | 0/5 | 0/5 | 0/5 | 0/5 | 0/5 | 0/5 |

The present invention is described in more detail by way of examples.

EXAMPLES 1 TO 10 AND COMPARATIVE EXAMPLE 1

An ultrasonic motor piezoelectric element having a length of 5.0 mm, a width of 1.5 mm, and a thickness of 1.5 mm was formed in such a manner that an Ag—Pd alloy electrode material paste (1 micrometer after firing) was printed on a piezoelectric green sheet (10 micrometers after firing), a green sheet laminate was prepared by stacking 150 piezoelectric green sheets, fired, and machined to give the above outer shape, and a side electrode was then formed to obtain an ultrasonic motor piezoelectric element (Comparative Example 1).

An ultrasonic motor piezoelectric element was formed in the same manner as in Comparative Example 1 which had the same outer shape as in Comparative Example 1 and in which a piezoelectric inactive layer was formed in the center portion in the stacking direction to a thickness of 2 to 40% of the total thickness of the ultrasonic motor piezoelectric element (Examples 1 to 10).

These elements were subjected to a 2.8 V driving endurance test at a temperature of 85° C. and a humidity of 85% RH. The results are shown in Table 1. A short circuit occurred in the ultrasonic motor piezoelectric element of Comparative Example 1 (piezoelectric inactive layer: 0%) after about 200 hr. The appearance of this element was observed and analyzed using a metallurgical microscope and SEM-EDS. An Ag migration was observed.

The period of time until a short circuit occurred was prolonged in the elements of Examples 1 to 10 as the thickness of the piezoelectric inactive layer increased, as shown in Table 1. A short circuit did not occur when the thickness of the piezoelectric inactive layer was 10% or more of the total thickness of the ultrasonic motor piezoelectric element.

As a result of SEM observation, a large number of pores was observed in the piezoelectric layer of Comparative Example 1 near the center in the thickness direction of the ultrasonic motor piezoelectric element (i.e., sintering was insufficient). The number of pores was reduced in Examples 1 to 10 along with an increase in the thickness of the piezoelectric inactive layer. The reasons therefor are not clarified. It is estimated that the sintering degree of the portion near the

EXAMPLES 11 TO 20 AND COMPARATIVE EXAMPLE 2

Ultrasonic motor piezoelectric elements were produced in the same manner as in Examples 1 to 10 and Comparative Example 1.

These elements were subjected to a polarization treatment under the following conditions.

Figure 14:
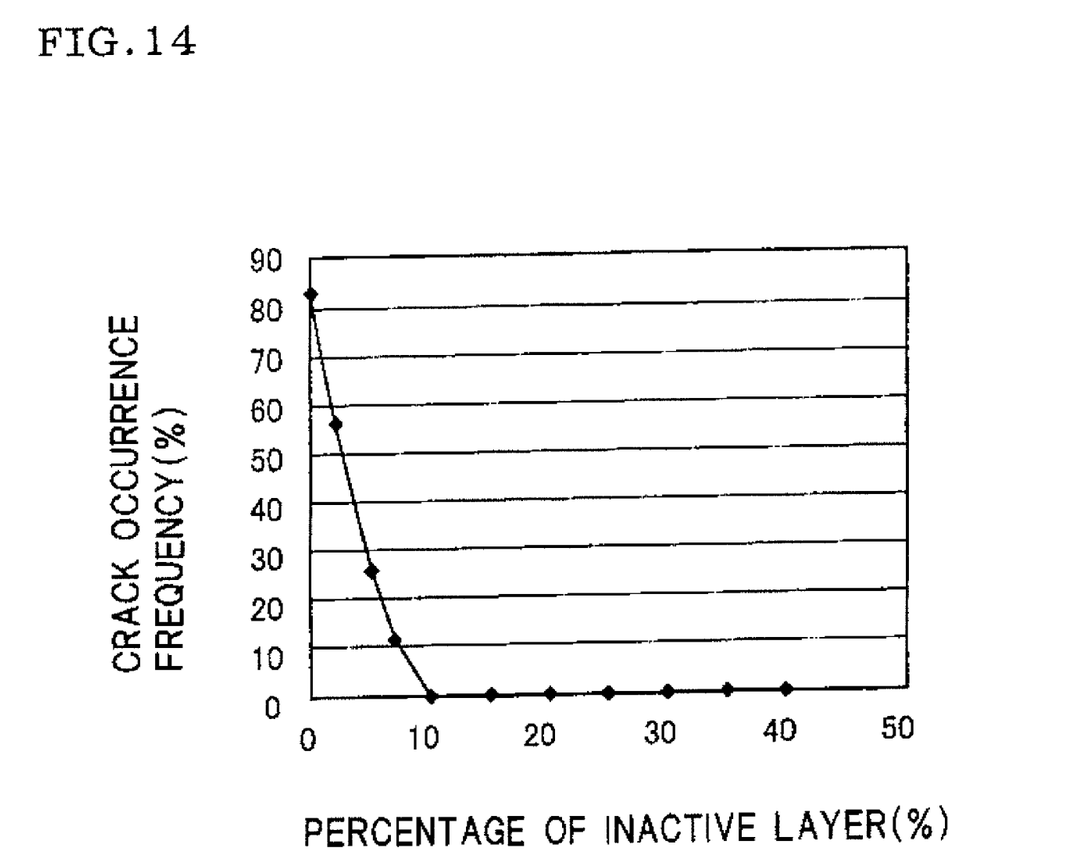
FIG. 14 is a graph showing crack occurrence frequencies of piezoelectric elements of Example 2 and Comparative Example 2 during a polarization treatment.

(Polarization Conditions)
Temperature: room temperature
Input signal: 10 kHz 0-250 V pulse wave
Time: 60 seconds The results are shown in Table 2 and FIG. 14 (graph).

TABLE 2

| | Percentage of inactive layer | Number of samples subjected to a polarization | Crack occurrence frequency (%) |
|---|---|---|---|
| Comparative Example 2 | 0% | 100 | 83 |
| Example 11 | 2% | 100 | 57 |
| Example 12 | 5% | 100 | 23 |
| Example 13 | 7% | 100 | 12 |
| Example 14 | 10% | 100 | 0.2 |
| Example 15 | 15% | 100 | 0.5 |
| Example 16 | 20% | 100 | 0 |
| Example 17 | 25% | 100 | 0.1 |
| Example 18 | 30% | 100 | 0.4 |
| Example 19 | 35% | 100 | 0.2 |
| Example 20 | 40% | 100 | 0.1 |

As is clear from the results shown in Table 2 and FIG. 14, cracks occurred to a large extent by the polarization treatment when the piezoelectric inactive layer was not formed near the center portion in the thickness direction of the element (Comparative Example 2). On the other hand, cracks occurred to only a small extent even by the polarization treatment in Examples 11 to 20 in which the piezoelectric inactive layer was formed near the center portion in the thickness direction of the element to a thickness of 2 to 40% of the total thickness of the element.

Since the ultrasonic motor using a piezoelectric actuator element of the present invention enables high-speed and highaccuracy microdistance positioning and exhibits high reliability, the ultrasonic motor can be utilized for an auto-focus mechanism, a zoom mechanism, and an image stabilizing mechanism of cameras. The ultrasonic motor is also suitably used in the field in which high reliability is required, such as a stage driving mechanism of an optical microscope, an electron microscope, and an atomic force microscope.

What is claimed is:

1. An ultrasonic motor piezoelectric actuator element using a primary longitudinal mode and a secondary bending mode, said ultrasonic motor piezoelectri c actuator element comprising:
   a stacked piezoelectric element in which piezoelectric layers and electrode layers are stacked alternately in such a manner that the electrode layers divide the piezoelectric layers into two approximately equal portions;
   wherein a piezoelectric inactive region is formed from a surface portion to a center portion in a thickness direction of the stacked piezoelectric element.

2. The ultrasonic motor piezoelectric actuator element according to claim 1, wherein the piezoelectric inactive region has a thickness of 10% or more of the thickness of the stacked piezoelectric actuator element in the stacking direction from the surface portion to the center portion.

3. The ultrasonic motor piezoelectric actuator element according to claim 1, wherein heat-generating portions which generate heat when subjecting the stacked piezoelectric element to a polarization treatment are dispersed.

4. The ultrasonic motor piezoelectric actuator element according to claim 1, wherein the stacked piezoelectric element is formed so that a formation density of the electrode layers is smaller in the center portion in the thickness direction of the stacked piezoelectric element than in the surface portion of the stacked piezoelectric element.

5. The ultrasonic motor piezoelectric actuator element according to claim 1, wherein the stacked piezoelectric element is formed so that an electrode-to-electrode distance is larger in the center portion in the thickness direction of the stacked piezoelectric element than in the surface portion of the stacked piezoelectric element.

6. The ultrasonic motor piezoelectric actuator element according to claim 1, wherein the stacked piezoelectric element is formed so that an area of the electrode layers is smaller in the center portion in the thickness direction of the stacked piezoelectric element than in the surface portion of the stacked piezoelectric element.

7. The ultrasonic motor piezoelectric actuator element according to claim 1, wherein the electrode layer is not formed in the center portion in the thickness direction of the stacked piezoelectric element.

* * * * *